(12) United States Patent
Ganesh

(10) Patent No.: US 8,868,360 B2
(45) Date of Patent: Oct. 21, 2014

(54) SYSTEM AND DEVICE FOR DETECTING DEFECTS IN UNDERGROUND CABLES

(75) Inventor: Meena Ganesh, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 374 days.

(21) Appl. No.: 13/098,186

(22) Filed: Apr. 29, 2011

(65) Prior Publication Data

US 2012/0278013 A1 Nov. 1, 2012

(51) Int. Cl.
*G01R 31/00* (2006.01)

(52) U.S. Cl.
USPC ............................................................ 702/59

(58) Field of Classification Search
USPC ............................................................ 702/59
See application file for complete search history.

(56) References Cited

U.S. PATENT DOCUMENTS

| | | | | |
|---|---|---|---|---|
| 5,386,538 A * | 1/1995 | Nye | | 711/3 |
| 5,530,364 A * | 6/1996 | Mashikian et al. | | 324/529 |
| 5,797,470 A * | 8/1998 | Bohnert et al. | | 186/53 |
| 6,115,377 A * | 9/2000 | Lutz et al. | | 370/391 |
| 6,499,002 B1 * | 12/2002 | Lancaster | | 702/191 |
| 6,798,211 B1 * | 9/2004 | Rockwell et al. | | 324/527 |
| 6,822,457 B2 * | 11/2004 | Borchert et al. | | 324/512 |
| 6,917,888 B2 * | 7/2005 | Logvinov et al. | | 702/59 |
| 7,069,116 B2 * | 6/2006 | Kunsman et al. | | 700/293 |
| 7,202,672 B2 * | 4/2007 | Hicks et al. | | 324/536 |
| 7,285,960 B2 * | 10/2007 | Koch et al. | | 324/536 |
| 7,427,867 B2 * | 9/2008 | Haynes et al. | | 324/603 |
| 7,532,012 B2 | 5/2009 | Cern | | |
| 7,558,703 B2 * | 7/2009 | Stoupis et al. | | 702/183 |
| 7,643,959 B2 * | 1/2010 | Maity et al. | | 702/123 |
| 7,672,812 B2 * | 3/2010 | Stoupis et al. | | 702/185 |
| 7,701,356 B2 * | 4/2010 | Curt et al. | | 340/635 |
| 7,863,905 B2 | 1/2011 | Cern | | |
| 7,969,159 B2 * | 6/2011 | Curt et al. | | 324/539 |
| 7,973,536 B2 * | 7/2011 | Kojovic et al. | | 324/512 |
| 8,022,708 B2 * | 9/2011 | Xie et al. | | 324/501 |
| 8,126,664 B2 | 2/2012 | Fournier et al. | | |
| 8,266,271 B2 * | 9/2012 | Oyadomari et al. | | 709/224 |
| 8,390,302 B2 * | 3/2013 | Mousavi et al. | | 324/539 |
| 8,402,150 B1 * | 3/2013 | Pike et al. | | 709/230 |
| 8,547,105 B2 * | 10/2013 | Jung et al. | | 324/527 |
| 2004/0027750 A1 * | 2/2004 | Minami et al. | | 361/62 |

(Continued)

FOREIGN PATENT DOCUMENTS

CN 101576600 11/2009
EP 1133701 6/2005

OTHER PUBLICATIONS

"Radio Frequency Current Transformers (RFCT)", Electrical Diagnostic Innovations, Inc., www.elec-di.com; 2 pages.

(Continued)

*Primary Examiner* — Sujoy Kundu
*Assistant Examiner* — Alvaro Fortich
(74) *Attorney, Agent, or Firm* — Nitin N. Joshi

(57) ABSTRACT

A system and device for detecting insulation defects in a cable are provided. The system and device include using signals received from sensors to detect a partial discharge caused by insulation defects in a cable. The system is passive, without signals being injected into system cables, and may use one or more sensors, data acquisition systems, gateway devices, and monitoring stations and is based on detecting partial discharge from insulation defects and reporting the detection when it occurs.

20 Claims, 7 Drawing Sheets

(56) References Cited

U.S. PATENT DOCUMENTS

| | | | |
|---|---|---|---|
| 2008/0048710 A1* | 2/2008 | Cern | 324/772 |
| 2008/0056338 A1* | 3/2008 | Yaney et al. | 375/222 |
| 2008/0103732 A1* | 5/2008 | Stoupis et al. | 702/188 |
| 2008/0231289 A1 | 9/2008 | Ganesh et al. | |
| 2009/0012727 A1* | 1/2009 | Siew et al. | 702/59 |
| 2009/0177420 A1* | 7/2009 | Fournier et al. | 702/59 |
| 2009/0189594 A1* | 7/2009 | Cern | 324/76.19 |
| 2010/0007352 A1* | 1/2010 | Xie et al. | 324/501 |
| 2010/0079148 A1* | 4/2010 | Park et al. | 324/536 |
| 2010/0253364 A1 | 10/2010 | Ganesh | |
| 2010/0318299 A1* | 12/2010 | Golparian et al. | 702/14 |
| 2011/0043219 A1 | 2/2011 | Ganesh et al. | |
| 2011/0077790 A1* | 3/2011 | Vaswani et al. | 700/291 |
| 2013/0006560 A1* | 1/2013 | Cern | 702/66 |

OTHER PUBLICATIONS

Phung, B.T., et al.; "Practical Experience in On-line Partial Discharge Monitoring of Power Cables", 2008 Australasian Universities Power Engineering Conference (AUPEC '08), Paper 261, 1-5.

Miri, S.M., et al.; "A Survey of Incipient Fault Detection and Location Techniques for Extruded Shielded Power Cables", 2002 IEEE, pp. 402-405.

Sidhu, Tarlochan S., et al.; "Detection of Incipient Faults in Distribution Underground Cables", IEEE Transactions on Power Delivery, vol. 25, No. 3, Jul. 2010.

\* cited by examiner

SYSTEM AND DEVICE FOR DETECTING DEFECTS IN UNDERGROUND CABLES

BACKGROUND OF THE INVENTION

The subject matter disclosed herein relates generally to underground cables and, more particularly, to a system and device for detecting defects in underground cables.

Underground cables enable electricity to travel from a power plant to residential and commercial customers. The cables include conductors where the electric current flows, and insulation that surrounds the conductors to inhibit the electric current from flowing outside the conductors. The cable insulation may deteriorate over time and become faulty, causing defects such as water trees and electrical trees in the insulation. A partial discharge refers to an abrupt change in current in the cable that may be generated during the breakdown of insulation or when arcs happen the cable and another insulator. Protracted partial discharge may further erode the cable insulation and result in a total breakdown of insulation, or complete cable failure.

Monitoring the underground cables to detect insulation defects using partial discharge analysis may be desirable in order to prevent a total breakdown of insulation or complete cable failure. When cables are monitored, a defect may be found early, such as before a complete breakdown occurs. The cable may be repaired or replaced to eliminate defects. Some monitoring systems perform monitoring based on a cable maintenance schedule. However, a monitoring system or device may provide quicker results if the underground cables are continuously monitored. Such a system enables a condition based monitoring which may improve efficiency and decrease cost. Thus, a need exists for a system or device that can continuously monitor for defects in underground cables.

BRIEF DESCRIPTION OF THE INVENTION

In accordance with one embodiment, a system for detecting insulation defects in a cable is provided. The system includes a first sensor externally coupled to the cable and configured to transmit a first signal. The system also includes a first data acquisition system coupled to the first sensor and configured to receive the first signal and to transmit a first set of signal features extracted from the first signal. The system includes a second sensor externally coupled to the cable and configured to transmit a second signal. The system also includes a second data acquisition system coupled to the second sensor and configured to receive the second signal, to extract a second set of signal features from the second signal, to receive the first set of signal features, and to compare the first and second sets of signal features to detect an insulation defect.

In accordance with another embodiment, a system for detecting insulation defects in a cable is provided. The system includes a first sensor externally coupled to the cable and configured to transmit a first signal. The system also includes a first data acquisition system coupled to the first sensor and configured to receive the first signal and to transmit a first set of signal features extracted from the first signal. The system includes a second sensor externally coupled to the cable and configured to transmit a second signal. The system also includes a second data acquisition system coupled to the second sensor and configured to receive the second signal and to transmit a second set of signal features extracted from the second signal. The system includes a gateway device configured to receive the first and second sets of signal features.

In accordance with a further embodiment, a data acquisition device for determining the location of insulation defects in a cable is provided. The data acquisition device includes a first input configured to receive a first signal from a first sensor and an analysis module configured to receive the first signal from the first input and to extract a first set of signal features from the first signal. The data acquisition device also includes a second input coupled to a transceiver and configured to receive a second set of signal features and a decision module configured to receive the first and second sets of signal features and to compare the first and second sets of signal features to detect an insulation defect.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As discussed herein, a system for detecting defects may be used with underground cable systems. The system may continuously or periodically monitor the underground cables in order to detect cable defects. The passive system disclosed enables the cables to be used for providing residential and/or commercial power while still monitoring for defects. When a defect is detected, the system may further determine a location of the defect. The monitoring system may then report the defect and defect location to a monitoring station. With an early warning provided, the cable may be repaired or replaced to inhibit further cable defects from occurring. Such a system may decrease the cost of maintaining an underground cable system.

Figure 1:
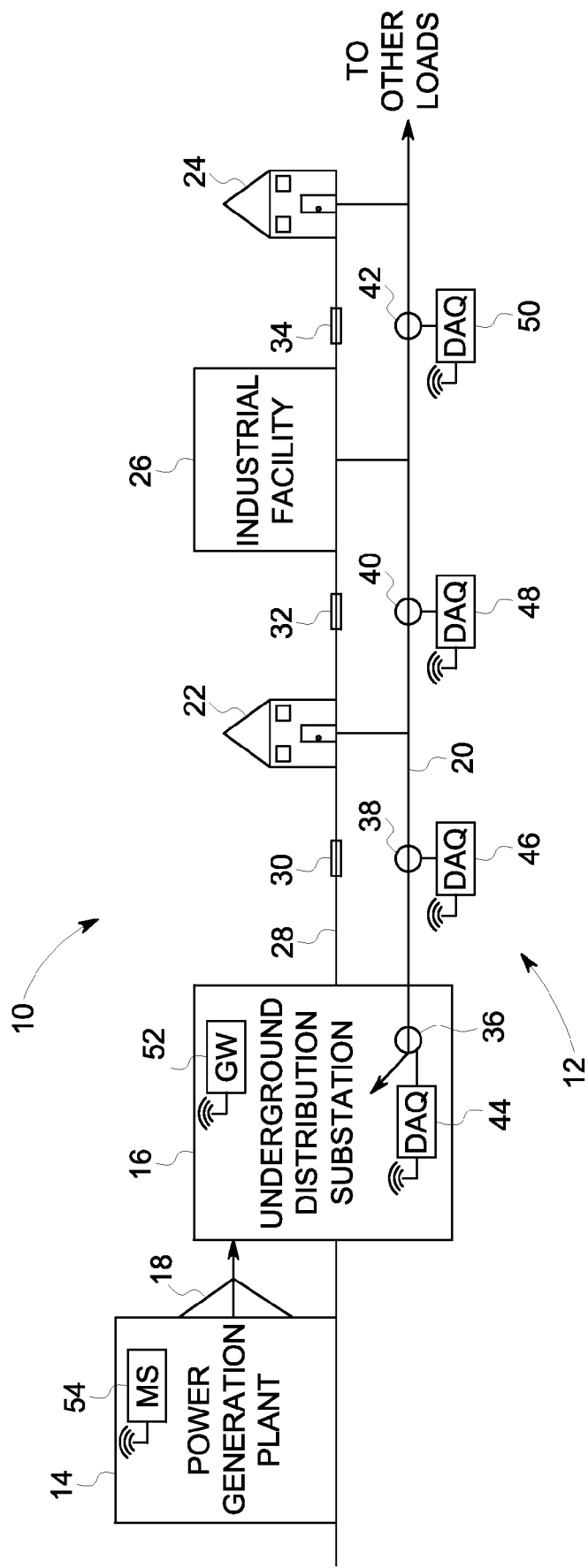
FIG. 1 is a diagrammatical view of an embodiment of a power grid system including a monitoring system for detecting partial discharge in an underground cable.

With the foregoing comments in mind and turning to FIG. 1, this figure illustrates diagrammatically a power grid system 10 including a monitoring system 12 for detecting partial discharge in an underground cable. In the illustrated embodiment, the power grid system 10 includes a power generation plant 14, an underground distribution substation 16, and cable systems 18 and 20. The power generation plant 14 provides electrical power to loads connected to the power grid system 10, such as residences 22 and 24, and an industrial facility 26. The power generation plant 14 may include one or more generators for converting mechanical energy into electrical power. Electrical power is carried from the power generation plant 14 to the underground distribution substation 16 using cable system 18. The underground distribution substation 16 may transform voltage from high to low with a step-down transformer, or transform voltage from low to high with a step-up transformer. Furthermore, the underground distribution substation 16 may include switches, protection equipment, and control equipment, in addition to one or more transformers.

As illustrated, electrical power is carried from the underground distribution substation 16 to the residences 22 and 24, and the industrial facility 26 using the underground cable system 20. The underground cable system 20 carries the electrical power below ground level 28. Manholes 30, 32, and 34 are positioned at various locations to provide access to the underground cable system 20, such as for maintenance, installation, and cable monitoring. For example, the monitoring system 12 may be installed and maintained using the manholes 30, 32, and 34 to access portions of the monitoring system 12.

The monitoring system 12 includes sensors 36, 38, 40, and 42, data acquisition systems 44, 46, 48, and 50, a gateway device 52, and a monitoring station 54. The number of sensors 36, 38, 40, and 42 and data acquisition systems 44, 46, 48, and 50 in certain embodiments may be less than or greater than the depicted four. For example, the monitoring system 12 may include 2, 3, 4, 5, 6, 10, 20, 50, 100, or any other number of sensors 36, 38, 40, and 42 and corresponding data acquisition systems 44, 46, 48, and 50. Likewise, the monitoring system 12 may include more than one gateway device 52 and monitoring station 54.

The sensors 36, 38, 40, and 42 are coupled to the underground cable system 20 at various locations to enable monitoring of the underground cable system 20. Furthermore, the sensors 36, 38, 40, and 42 may be placed on, around, or adjacent to cable segments of the underground cable system 20 in order to monitor the electrical power running through the cables. For example, the sensors 36, 38, 40, and 42 may be clamped to the underground cable system 20. The sensors 36, 38, 40, and 42 may be any type of sensor commercially or otherwise available that can passively monitor the electrical power running through the cables. For example, the sensors 36, 38, 40, and 42 may each be a radio frequency current transformer (RFCT). Passive monitoring enables the electric power running through the underground cable system 20 to be monitored external to the cables without interfering with the electric power running through the cables. As such, passive monitoring enables the monitoring system 12 to monitor signals that emanate from the underground cable system 20 when a fault happens. A fault is defined as a discharge happening through the insulation cracks. Typically when insulation has electrical trees, the electrical trees will cause a discharge.

Each sensor 36, 38, 40, and 42 is coupled to a respective data acquisition system 44, 46, 48, and 50, such as via a cable or wirelessly. The data acquisition systems 44, 46, 48, and 50 receive signals transmitted from the sensors 36, 38, 40, and 42. The signals are analyzed by the data acquisition systems 44, 46, 48, and 50 to determine if an insulation defect is detected from one of the sensors 36, 38, 40, and 42.

If a defect is detected, data acquisition systems 44, 46, 48, and 50 communicate with each other, or another device in the monitoring system 12, to verify that the defect occurred and to calculate a location of the defect. Specifically, the data acquisition systems 44, 46, 48, and 50 and/or the sensors 36, 38, 40, and 42 may be organized into pairs including a master data acquisition system and a slave data acquisition system. Together, the master and slave data acquisition systems may verify that a defect occurred and to calculate the location of the defect.

When organized into pairs, each data acquisition system 44, 46, 48, and 50 and/or sensor 36, 38, 40, and 42 may be part of two different pairs. For example, one pair may include data acquisition system 44 configured as a master and data acquisition system 46 configured as a slave. A second pair may include data acquisition system 48 configured as a master and data acquisition system 46 configured as a slave. Furthermore, a third pair may include data acquisition system 48 configured as a master and data acquisition system 50 configured as a slave. Thus, with such a configuration, the underground cable system 20 may be monitored by the first, second, and third data pair to enable monitoring coverage between data acquisition system 44 and data acquisition system 50. Furthermore, each data acquisition system 44, 46, 48, and 50 may regularly synchronize an internal clock with a standardized time, such as a NIST clock, or using GPS. In addition, each pair of data acquisition systems may regularly synchronize an internal clock with each other, such as once per day, or once per hour, for example.

In one embodiment, the data acquisition systems 44, 46, 48, and 50 communicate wirelessly with the gateway device 52. The gateway device 52 receives data from the data acquisition systems 44, 46, 48, and 50 indicating that a defect occurred and indicating the location of the defect. The gateway device 52 may be any device that may receive data from the data acquisition systems 44, 46, 48, and 50 and transmit the data to the monitoring station 54. For example, the gateway device 52 may be a Wireless Gateway, a WireLess product made by WiYZ. In certain embodiments, the gateway device 52 may be a desktop computer, laptop computer, a wireless collector/repeater, or another wireless device.

The gateway device 52 transmits the defect data to the monitoring station 54. In certain embodiments, the gateway device 52 may communicate via supervisory control and data acquisition (SCADA) or server side includes (SSI). The monitoring station 54 may be any device that may receive data from the gateway device 52 and display the data. For example, the monitoring station 54 may be a desktop or laptop computer. In certain embodiments, the gateway device 52, or the monitoring station 54 may receive data directly from the data acquisition systems 44, 46, 48, and 50 to verify that a defect occurred and to calculate the location of the defect. Still, in further embodiments, the gateway device 52 may receive data directly from the data acquisition systems 44, 46, 48, and 50, then transmit the data to the monitoring station 54 to verify that a defect occurred and to calculate the location of the defect.

Figure 2:
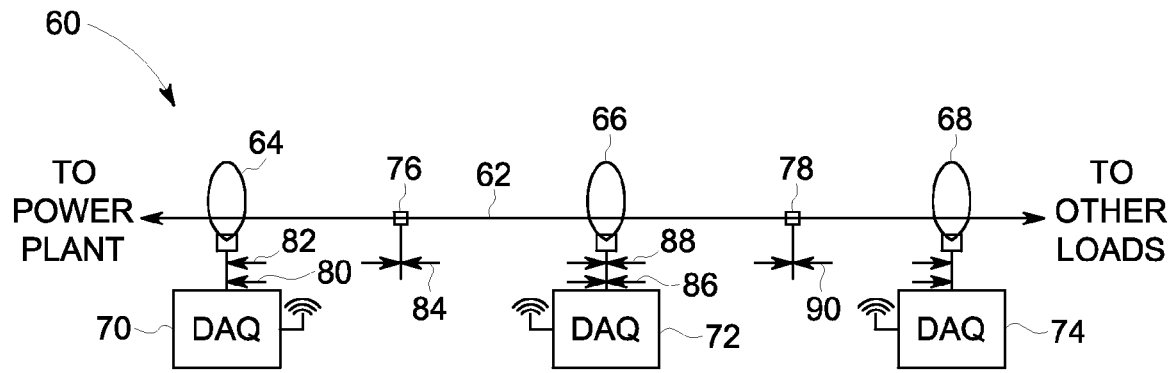
FIG. 2 is a diagrammatical view of an embodiment of a monitoring system for detecting insulation defects using partial discharge analysis in an underground cable.

With the foregoing in mind, FIG. 2 is a diagrammatical view of a monitoring system 60 for detecting an insulation defect in an underground cable 62. In the illustrated embodiment, the monitoring system 60 includes sensors 64, 66, and 68 and data acquisition systems 70, 72, and 74. The sensors 64, 66, and 68 are coupled to the underground cable 62. Like the sensors described in FIG. 1, the sensors 64, 66, and 68 may be placed on, around, or adjacent to cable segments of the underground cable 62 in order to monitor the electrical power running through the cables. For example, the sensors 64, 66, and 68 may be clamped to the underground cable 62. The sensors 64, 66, and 68 may be any type of sensor commercially or otherwise available that can passively monitor the electrical power running through the cables. For example, the sensors 64, 66, and 68 may each be a radio frequency current transformer (RFCT).

Each sensor 64, 66, and 68 is coupled to a respective data acquisition system 70, 72, and 74. The data acquisition systems 70, 72, and 74 receive signals transmitted from the sensors 64, 66, and 68. The signals are analyzed by the data acquisition systems 70, 72, and 74 to determine if a defect is detected from one of the sensors 64, 66, and 68. The illustrated underground cable 62 includes defects 76 and 78. Defect 76 is located on the section of the underground cable 62 between sensors 64 and 66. Thus, the data acquisition systems 70 and 72 may detect the defect 76 and calculate the location of the defect 76.

As illustrated, the sensors 64 and 66 may be separated by a distance 80. In certain embodiments, the distance 80 may be approximately 90 to 300 meters. Specifically, the distance 80 may be approximately 290 meters. A distance 82 is the distance from the sensor 64 to the defect 76, while a distance 84 is the distance from the defect 76 to the sensor 66. The combination of distances 82 and 84 total the distance 80. For example, the distance 82 may be approximately 80 meters, while the distance 84 may be approximately 210 meters. In such a case, the distance 80 would be approximately 290 meters. As another example, the distance 82 may be approximately 30 meters, while the distance 84 may be approximately 70 meters. In such a case, the distance 80 would be approximately 100 meters.

Defect 78 is located on the section of the underground cable 62 between sensors 66 and 68. Thus, the data acquisition systems 72 and 74 may detect the defect 78 and determine the location of the defect 78. As illustrated, the sensors 66 and 68 may be separated by a distance 86. In certain embodiments, the distance 86 may be approximately 60 to 350 meters. For example, the distance 86 may be approximately 250 meters. A distance 88 is the distance from the sensor 66 to the defect 78, while a distance 90 is the distance from the defect 78 to the sensor 68. The combination of distances 88 and 90 total the distance 86. For example, the distance 88 may be approximately 200 meters, while the distance 90 may be approximately 50 meters. In such a case, the distance 86 would be approximately 250 meters. As another example, the distance 88 may be approximately 60 meters, while the distance 90 may be approximately 10 meters. In such a case, the distance 86 would be approximately 70 meters. It should be noted that the sensors 64, 66, and 68 have a distance 80 or 86 between their locations close enough to enable the data acquisition systems 70, 72, and 74 to wirelessly communicate with each other and with a gateway device. For example, in certain embodiments, the data acquisition systems 70, 72, and 74 may have a wireless transmission range of approximately 900 meters, therefore the data acquisition systems 70, 72, and 74 are positioned to be within approximately 900 meters of a gateway device.

Figure 3:
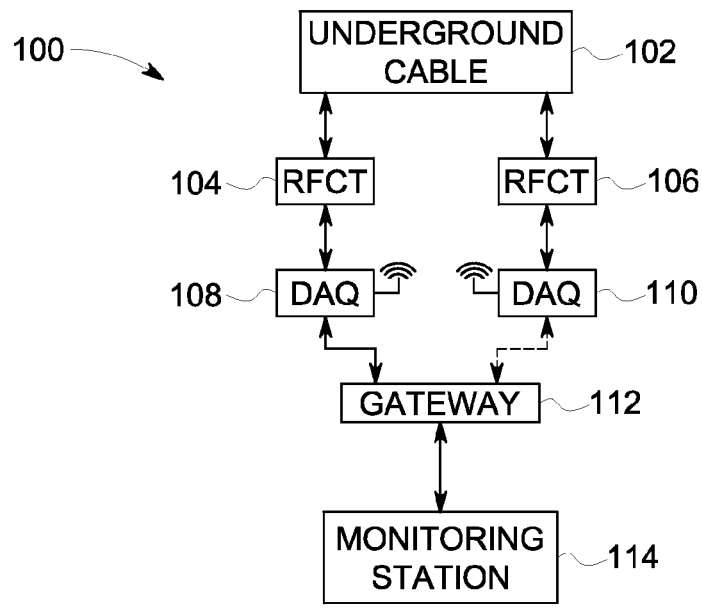
FIG. 3 is a flow chart of an embodiment of a monitoring system for detecting insulation defects using partial discharge analysis in an underground cable.

Turning to FIG. 3, illustrated is a flow chart 100 of a monitoring system for detecting an insulation defect in an underground cable. In the illustrated embodiment, the flow chart 100 shows how data may flow between various parts of the monitoring system. Specifically, an underground cable 102 provides data to sensors 104 and 106, such as RFCT sensors. The sensor 104 communicates with a data acquisition system 108, while the sensor 106 communicates with a data acquisition system 110. In certain embodiments, the data acquisition systems 108 and 110 may communicate with each other, such as with a master/slave relationship.

The data acquisition system 108 communicates defect data to a gateway device 112. Furthermore, in certain embodiments, the data acquisition system 110 also communicates defect data to the gateway device 112. In such a system, the gateway device 112 or a monitoring station 114 may formulate decisions using data from each data acquisition system 108 and 110 to determine whether there is a defect, and the location of the defect. As illustrated, the gateway device 112 communicates defect data to the monitoring station 114.

Figure 4:
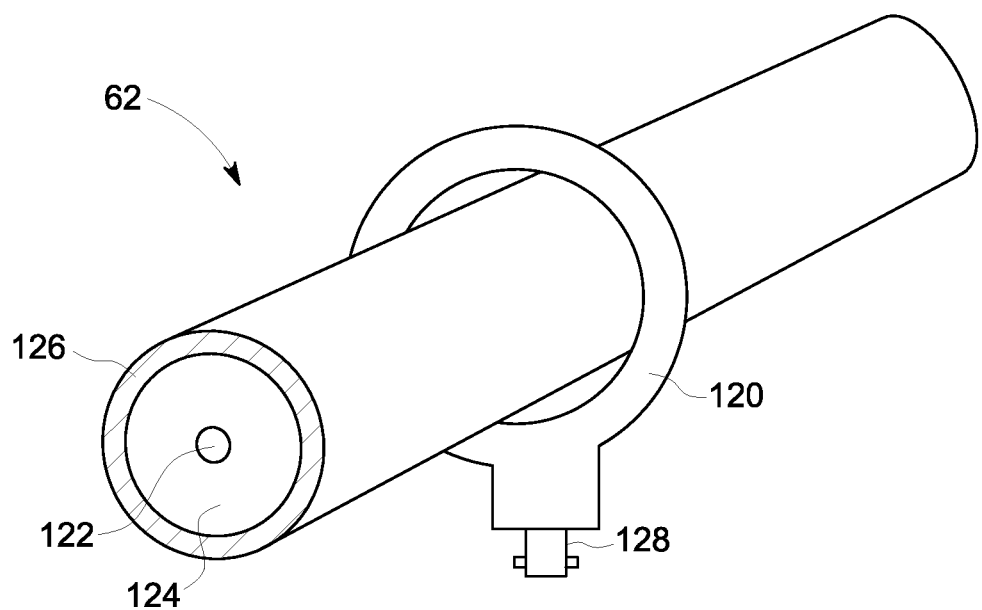
FIG. 4 is a perspective view of an embodiment of an underground cable with a sensor for monitoring electrical power.

FIG. 4 illustrates a perspective view of an underground cable 62 with a sensor 120 for monitoring electrical power. The underground cable 62 includes a conductive core 122 surrounded by a layer of insulation 124. The insulation 124 may be surrounded by a sheath 126. The conductive core 122 carries electrical power, while the insulation 124 and sheath 126 protect the cable 62 from mechanical damage and inhibit the conductive core 122 from directly contacting another electrically conductive material. The sensor 120 is illustrated as surrounding the sheath 126. In certain embodiments, the sensor 120 may be clamped around the sheath 126, or secured to the cable 62 in another manner. The sensor 120 includes a connector 128 for coupling the sensor 120 with a data acquisition system. As illustrated, the connector 128 may be a BNC type connector, or any other connector which enables data to be transmitted from the sensor 120.

Figure 5:
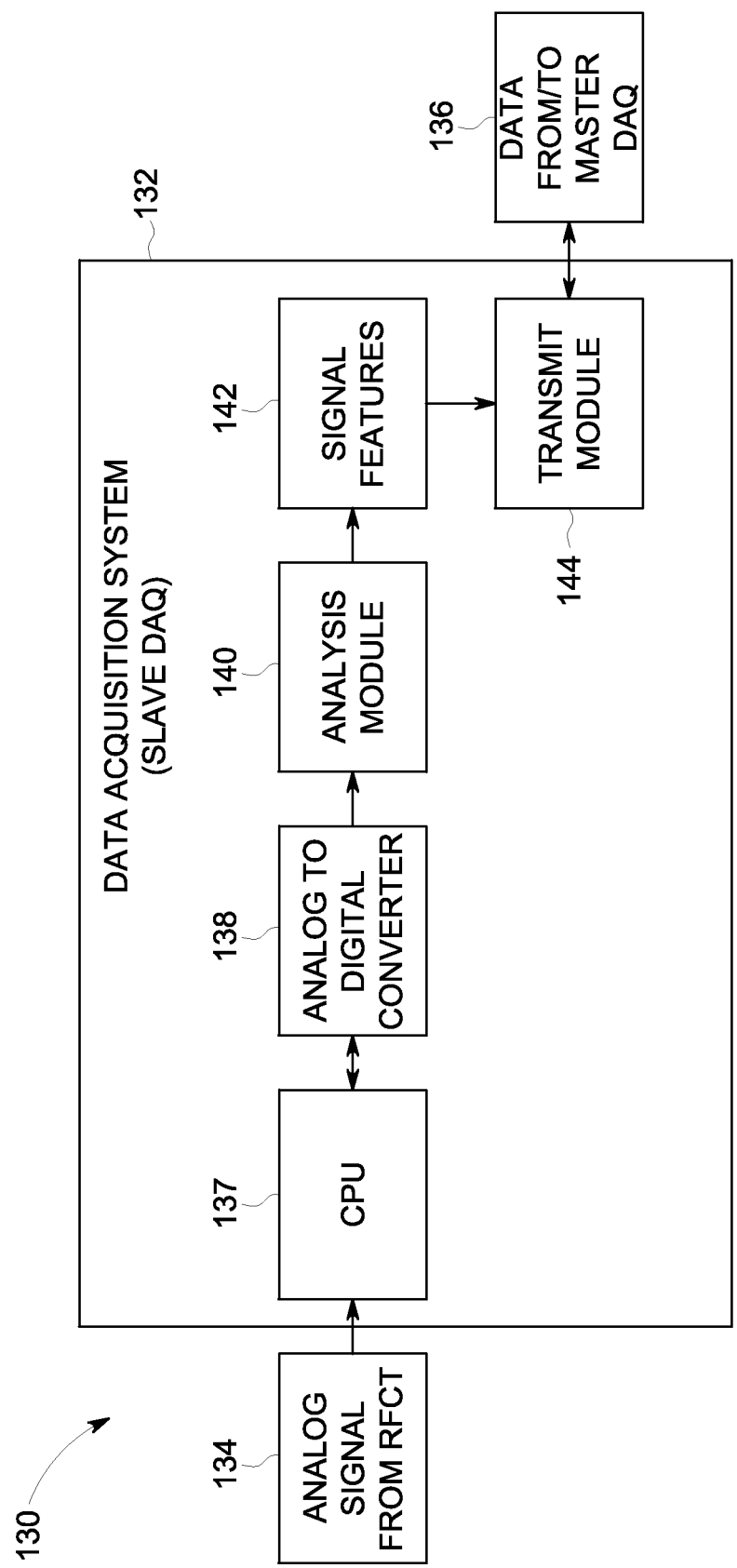
FIG. 5 is a flow diagram of an embodiment of a slave data acquisition system that may be included in the monitoring system of FIG. 1.

Moving on to FIG. 5, illustrated is a flow diagram 130 of a slave data acquisition system (slave DAQ) 132 that may be included in the monitoring system 12 of FIG. 1. In certain embodiments where the data acquisition systems do not have a master/slave relationship, the slave DAQ 132 illustrated may be the data acquisition system used. For example, the slave DAQ 132 may be one embodiment of a data acquisition system in systems where all data acquisition systems communicate directly with a gateway device. In the illustrated embodiment, the slave DAQ 132 receives an analog signal 134 from a sensor, such as an RFCT. The slave DAQ 132 processes the analog signal 134 and transmits data 136 to and/or from a master data acquisition system, such as the master data acquisition system described in FIG. 6. In certain embodiments, the slave DAQ 132 transmits data 136 to a gateway device, or a monitoring station. Although an analog signal 134 is depicted, other embodiments of the slave DAQ 132 may receive a digital signal.

As illustrated, the slave DAQ 132 includes a central processing unit (CPU) 137 which receives the analog signal 134 and provides the signal to an analog-to-digital converter 138. The analog-to-digital converter 138 converts the analog signal 134 to a digital signal which includes digital data. An analysis module 140 analyzes the digital data to detect a defect in the data, such as a partial discharge. Furthermore, the analysis module 140 may use algorithms and decision models in order to determine whether or not the digital data indicates the presence of one or more defects. One embodiment of the analysis module 140 is described below in relation to FIG. 7. If defects are detected, the analysis module 140 reduces the size of the digital data to include certain signal features 142. For example, the digital data may include approximately 2500 bytes of data, while the extracted signal features 142 include approximately 100 bytes of data. The signal features 142 include data that may be used to correlate with another set of signal features and to calculate the location of the defect. A transmit module 144 sends the signal features 142 as part of the data 136. The transmit module 144 includes a wireless network card for transmitting the data 136 wirelessly. Such a wireless network card may be a Peripheral Component Interconnect (PCI) card that may communicate up to 900 meters, for example.

With the digital data reduced to signal features 142, such as with a 96 percent reduction in size, the data 136 transmitted to the master data acquisition system is greatly reduced. Therefore, the wireless communication traffic may be limited. As may be appreciated, the slave DAQ 132 may receive data 136 from the master data acquisition system or other monitoring system device. For example, the slave DAQ 132 may receive an acknowledgment signal or a status check signal. Likewise, the slave DAQ 132 may send data 136 other than signal features 142 to the master data acquisition system or other monitoring system device. For example, the slave DAQ 132 may send data reporting on the status of the slave DAQ 132, among other things. As may be appreciated, the analog-to-digital converter 138, analysis module 140, and transmit module 144 may each include memory, storage, or a buffer area to temporarily store data while the data is being processed or analyzed. Furthermore, the memory, storage, or buffer area may be cleared as needed for additional data, such as when a decision based on the data has been made.

Figure 6:
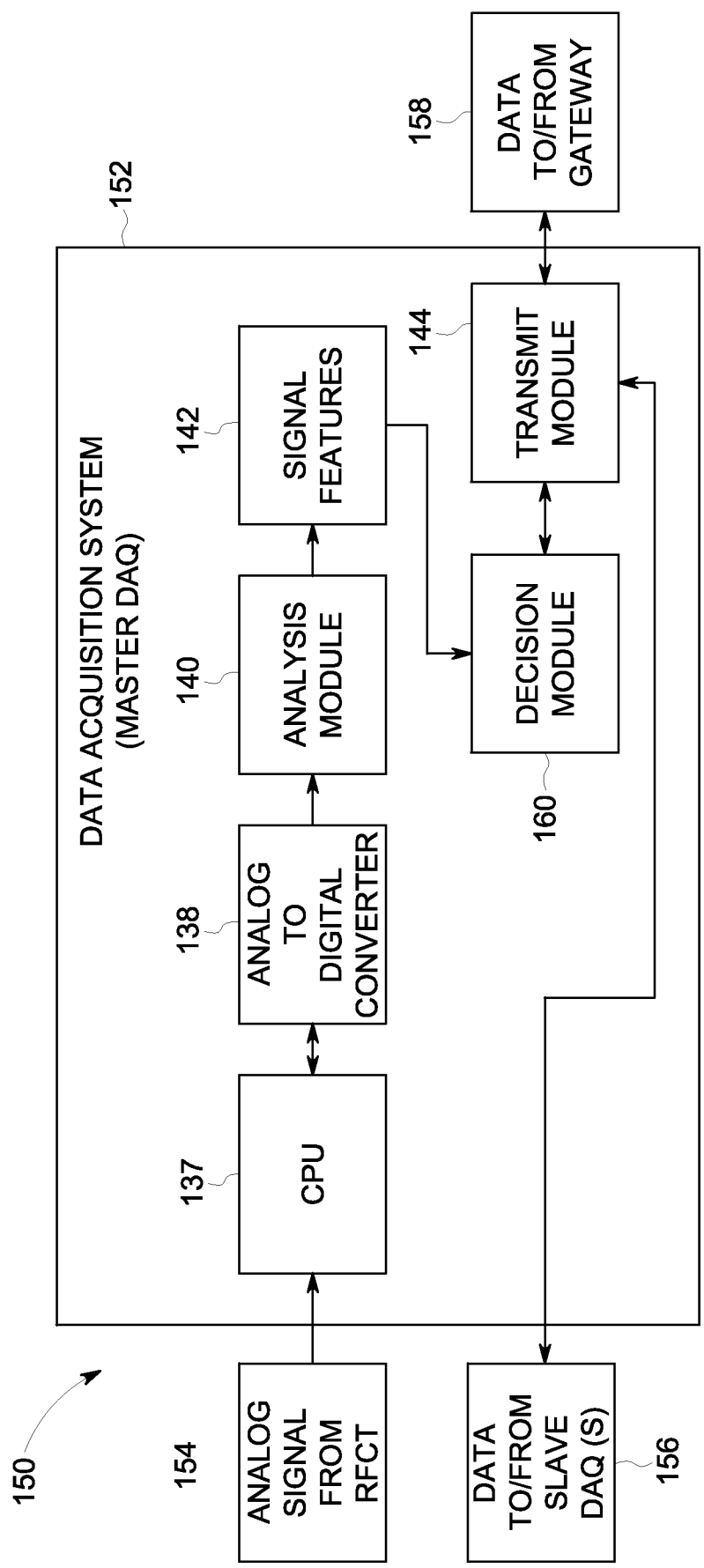
FIG. 6 is a flow diagram of an embodiment of a master data acquisition system that may be included in the monitoring system of FIG. 1.

Turning to FIG. 6, illustrated is a flow diagram 150 of a master data acquisition system (master DAQ) 152 that may be included in the monitoring system 12 of FIG. 1. In the illustrated embodiment, the master DAQ 152 receives an analog signal 154 from a sensor, such as an RFCT. The master DAQ 152 also transmits data 156 to and/or from a slave DAQ, such as the slave DAQ 132 of FIG. 5. The master DAQ 152 processes the analog signal 154 and transmits data 158 to and/or from a gateway device, such as the gateway device 52 of FIG. 1. Although an analog signal 154 is depicted, other embodiments of the master DAQ 152 may receive a digital signal, such as from a digital sensor.

As illustrated, the master DAQ 152 includes a central processing unit (CPU) 137 which receives the analog signal 154 and provides the signal to an analog-to-digital converter 138. The analog-to-digital converter 138 converts the analog signal 154 to a digital signal which includes digital data. An analysis module 140 analyzes the digital data to detect a defect in the data, such as a partial discharge. Furthermore, the analysis module 140 may use algorithms and decision models in order to determine whether or not the digital data indicates the presence of one or more defects. One embodiment of the analysis module 140 is described below in relation to FIG. 7. If defects are detected, the analysis module 140 processes the digital data to extract certain signal features 142. For example, the digital data may include approximately 2500 bytes of data, while the extracted signal features 142 include approximately 100 bytes of data. The signal features 142 include data that may be used to correlate with another set of signal features and to calculate the location of the defect.

A decision module 160 receives the signal features 142 and data 156 from a slave DAQ, which includes signal features from the slave DAQ. The decision module 160 makes a final defect decision based on the data. One embodiment of the decision module 160 is described below in relation to FIG. 8. A transmit module 144 sends the final defect decision as part of the data 158. The final defect decision data includes information about the defect, such as the location of the defect. As may be appreciated, the master DAQ 152 may receive data 158 from the gateway device or another device in the monitoring system. For example, the master DAQ 152 may receive an acknowledgment signal or a status check signal. Likewise, the master DAQ 152 may send data 158, other than defect data, to the gateway device. For example, the master DAQ 152 may send data reporting on the status of the master DAQ 152, among other things. As may be appreciated, the decision module 160 may include memory, storage, or a buffer area to temporarily store data while the data is being processed or analyzed. Furthermore, the memory, storage, or buffer area may be cleared as needed for additional data, such as when a decision based on the data has been made.

Figure 7:
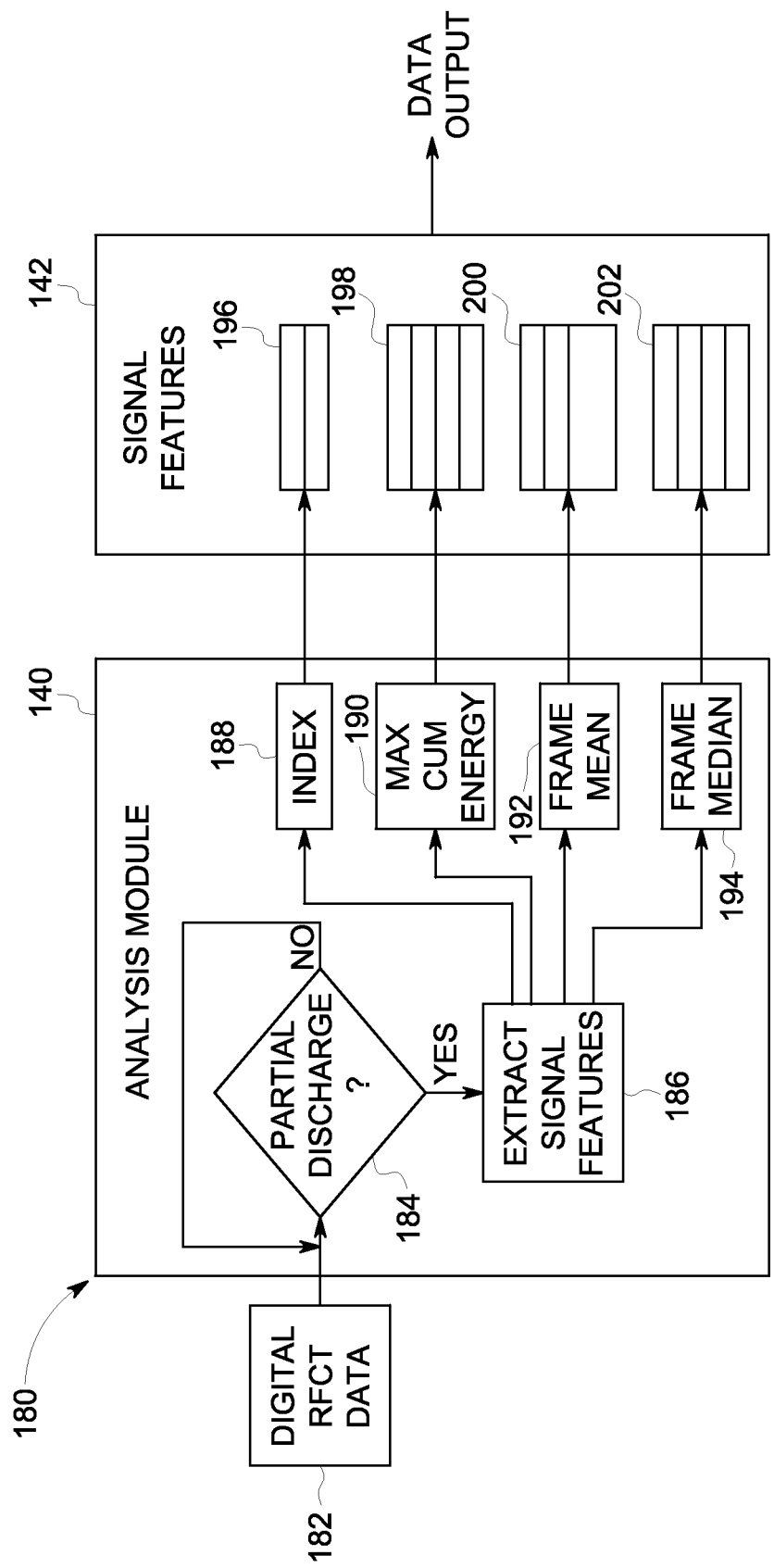
FIG. 7 is a flow diagram of an embodiment of an analysis module that may be included in the data acquisition system of FIG. 5 or FIG. 6.

Turning to FIG. 7, illustrated is a flow diagram 180 of an embodiment of an analysis module 140 that may be included in the data acquisition system 132 or 152 of FIG. 5 or FIG. 6. The analysis module 140 receives digital data 182, analyzes the data 182 and outputs signal features 142. The digital data 182 may be data transmitted directly from a sensor, such as an RFCT, or the digital data 182 may be data transmitted from an analog-to-digital converter, such as the analog-to-digital converter 138 illustrated in FIGS. 5 and 6. Furthermore, the digital data 182 is received and/or organized into groups of data, such as 5000 byte groups for example.

The analysis module 140 may apply one or more tests, calculations, or models on the digital data 182 to determine whether there is an insulation defect, as depicted in block 184. For example, the analysis module 140 may include a trigger signal level to indicate a partial discharge occurred from the insulation defect. If the analysis in block 184 determines that the digital data 182 does not contain data indicating a partial discharge, the flow diagram returns to the input of block 184 to analyze additional digital data 182. However, if the analysis in block 184 determines that the digital data 182 contains data indicating a partial discharge, signal features may be extracted at block 186.

Any number of signal features may be extracted from the digital data 182, such as signal features from a statistical group (e.g., minimum, maximum, mean, harmonic or geometric mean, RMS, crest factor, absolute deviation, standard deviation, skew, kurtosis), shape related group (e.g., area, amplitude when curve fitted as Weibull, shape when curve fitted as Weibull, regression, slope, inflection point, maximum point), signal processing group (e.g., amplitude, frequency, or phase with DC removed, top ten highest frequencies, index, maximum cumulative energy, frame mean, frame median), database relational group (e.g., test identification number, raw data filename, channel number, pulse number, threshold voltage, update time) and/or decision group (e.g., actual or predicted noise, manual partial discharge, predicted partial discharge). To obtain the signal features, various calculations or formulas may be used. For example, continuous wavelet transforms (CWT) may be used to convert a group of digital data 182 from a time-frequency representation to a time-scale representation. The CWT coefficients may be obtained by using db2 or bior wavelets.

Furthermore, cumulative energy may be calculated by summing the square of the CWT coefficients. Certain signal features may be extracted and/or calculated from the group of digital data 182 based on the calculated cumulative energy. Specifically, an index 188, a maximum cumulative energy 190, a frame mean 192, and a frame median 194 may be calculated and/or extracted. The index 188 is the sample number when the maximum cumulative energy 190 occurs in the group of digital data 182. When the index 188 is correlated with a time stamp, the time when the maximum cumulative energy 190 occurred may be determined. The maximum cumulative energy 190 is the maximum cumulative energy that correlates to the index 188. A group of digital data 182 may be subdivided into frames. For example, a group of digital data 182 may be divided into 100 frames. Therefore, if a group of digital data 182 includes 5000 bytes or samples, such a frame would include 50 bytes or samples. Thus, the frame mean 192 is the mean from the frame that contains the maximum cumulative energy 190. Furthermore, the frame median 194 is the median from the frame with the maximum cumulative energy 190.

The extracted data is combined to create the signal features 142 data packet. For example, as illustrated the index 188 may move to block 196, the maximum cumulative energy 190 may move to block 198, the frame mean 192 may move to block 200, and the frame median 194 may move to block 202. Furthermore, a time stamp may be added to the signal features 142 to correlate the signal features 142 between multiple data acquisition systems. The signal features 142 are output for further processing or transmission to another device.

Figure 8:
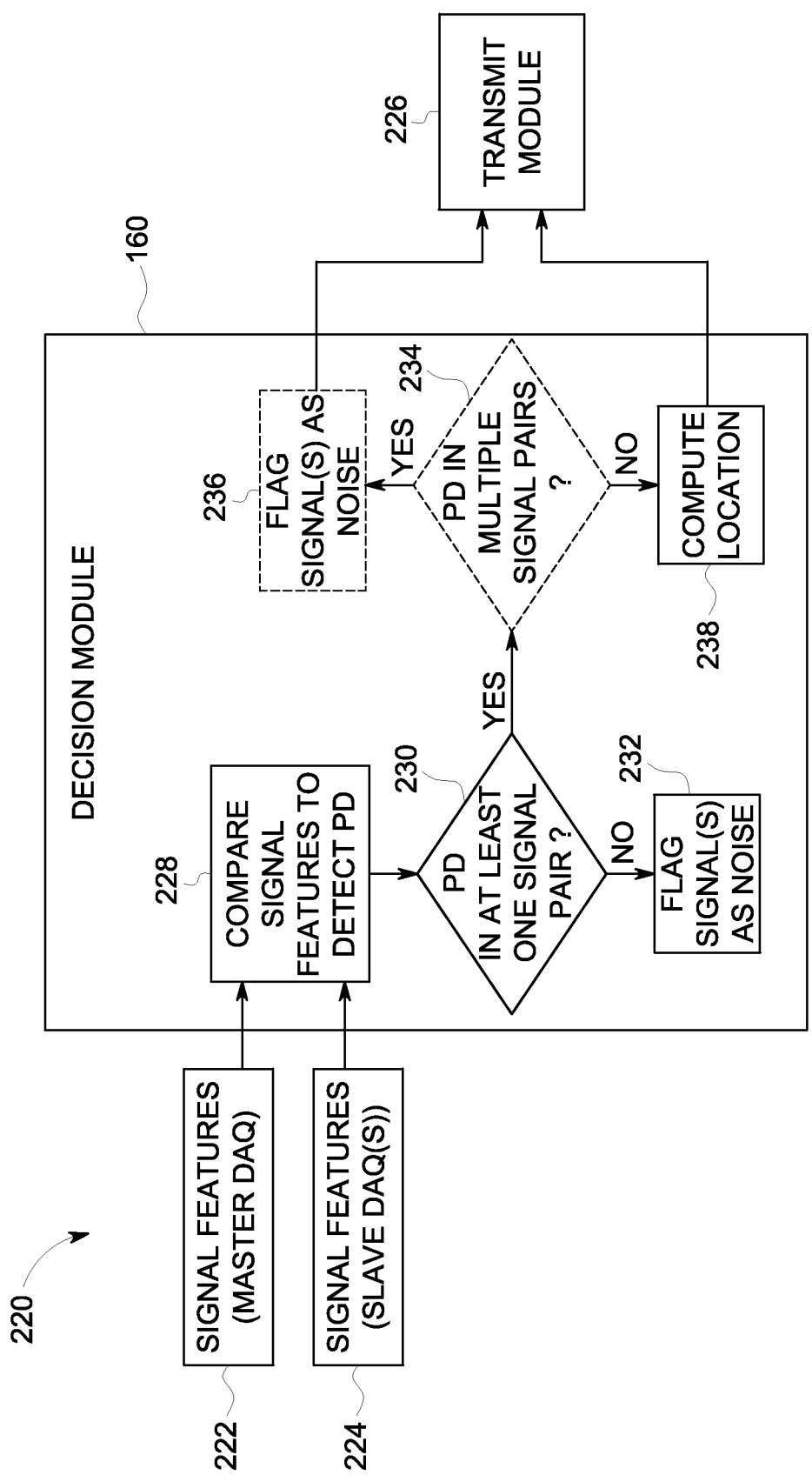
FIG. 8 is a flow diagram of an embodiment of a decision module that may be included in the data acquisition system of FIG. 6.

Illustrated in FIG. 8 is a flow diagram 220 of an embodiment of a decision module 160 that may be included in the data acquisition system 152 of FIG. 6. The decision module 160 receives signal features 222 from a master DAQ and receives signal features 224 from one or more slave DAQs. The decision module 160 makes a decision about whether a partial discharge has occurred and determines the location of an existing partial discharge. If a partial discharge has occurred, the decision module 160 sends the information to a transmit module 226 where it is transmitted to another device, such as a gateway device.

The signal features 222 and 224 enter the decision module where they are compared, at block 228. Then, at block 230, a decision is made as to whether a partial discharge is detected in a master/slave pair. For example, if the signal features 222 from a master DAQ indicate a partial discharge occurred at a first time and the signal features 224 from a slave DAQ indicate a partial discharge occurred at a second time, as long as at the first and second times are close enough to indicate that a partial discharge occurred on the cable between the master and slave DAQ, then a partial discharge in the pair will be reported. If a partial discharge is not detected in the pair of signal features 222 and 224, the pair of signal features 222 and 224 will be flagged as noise, as depicted by block 232.

However, if a partial discharge is detected in the pair of signal features 222 and 224, the decision module 160 may determine whether a partial discharge is detected in multiple signal pairs, at block 234. For example, signal features 222 may be from one master DAQ, while signal features 224 may be from two slave DAQs, both of which are a slave to the master DAQ. If a partial discharge is detected in multiple signal pairs, the decision module 160 may flag the signal or signals as containing noise, per block 236. The decision module 160 may then send the flagged signal data to the transmit module 226 to be transmitted to a gateway device.

If a partial discharge is not detected in multiple signal pairs, per block 234, or if block 234 is not included in the decision module 160, then the location of the partial discharge is computed, per block 238. The location is an estimated location of the partial discharge based on data from the signal features 222 and 224. This estimation is based on the time of arrival of the maximum cumulative energy 190, as described in FIG. 7, from each set of signal features 222 and 224. The time of arrival may be computed based on the sample index 188 as described in FIG. 7 and timing information that is included with the signal features 222 and 224. Furthermore, the estimated location is determined using the known distance between the sensors. By assuming that the disturbance in the signal produced by the discharge event propagates at a constant velocity in both directions along the monitored cable until it is detected at each sensor, a distance from the first sensor in the direction of the second sensor can be estimated. One formula that may be used to estimate this distance is: $d=(L-v*(t_1-t_2))/2$. Specifically, d is the distance away from a first sensor toward a second sensor where the partial discharge is located; L is the distance between the sensors; v is the propagation velocity along the cable; $t_1$ is the time of the maximum cumulative energy signal at the first sensor; and $t_2$ is the time of the maximum cumulative energy signal at the second sensor. If the computed location is valid, the location and partial discharge information is wirelessly sent by the transmit module 226 to another device in the monitoring system.

The systems, devices, and methods described above may be used to continuously or periodically monitor underground cable systems, or other cable systems, for defects such as partial discharge. Certain embodiments may include few or greater number of steps or devices to detect such defects. As may be appreciated, detecting defects quickly may enable cable systems to be maintained and operate efficiently. Furthermore, the defects may be detected passively without injecting signals into the cable systems, thereby decreasing cable system downtime and costs associated with such downtime.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system for detecting insulation defects in a cable comprising:
    a first sensor externally coupled to the cable and configured to transmit a first signal;
    a first data acquisition system coupled to the first sensor and configured to receive the first signal and to transmit a first set of signal features extracted from the first signal when data indicating a partial discharge is detected in the first signal;
    a second sensor externally coupled to the cable and configured to transmit a second signal; and
    a second data acquisition system coupled to the second sensor and configured to receive the second signal, to extract a second set of signal features from the second signal, to receive the first set of signal features, and to compare the first and second sets of signal features to detect an insulation defect.

2. The system of claim 1, wherein the first data acquisition system is configured to wirelessly transmit the first set of signal features extracted from the first signal and the second data acquisition system is configured to wirelessly receive the first set of signal features.

3. The system of claim 1, wherein the second data acquisition system is configured to calculate an insulation defect location in the cable using the first and second sets of signal features.

4. The system of claim 3, wherein the second data acquisition system is configured to wirelessly transmit the calculated insulation defect location to a gateway device.

5. The system of claim 1, comprising a gateway device configured to wirelessly receive data from the first data acquisition system, the second data acquisition system, or both data acquisition systems.

6. The system of claim 1, wherein the first and second sets of signal features each comprise data indicating a time of a partial discharge.

7. The system of claim 1, wherein the first and second sensors each passively monitor the cable to detect when partial discharge occurs from an insulation defect.

8. A system for detecting insulation defects in a cable comprising:
   a first sensor externally coupled to the cable and configured to transmit a first signal;
   a first data acquisition system coupled to the first sensor and configured to receive the first signal and to transmit a first set of signal features extracted from the first signal when data indicating a partial discharge is detected in the first signal;
   a second sensor externally coupled to the cable and configured to transmit a second signal;
   a second data acquisition system coupled to the second sensor and configured to receive the second signal and to transmit a second set of signal features extracted from the second signal; and
   a gateway device configured to receive the first and second sets of signal features.

9. The system of claim 8, wherein the gateway device is configured to wirelessly receive the first and second sets of signal features and to determine whether an insulation defect exists on the cable between the first and second sensors.

10. The system of claim 8, wherein the gateway device is configured to calculate an insulation defect location using the first and second sets of signal features.

11. The system of claim 8, wherein the gateway device is configured to transmit the first and second sets of signal features to a monitoring station.

12. The system of claim 8, comprising a monitoring station configured to wirelessly receive the first and second sets of signal features from the gateway device.

13. The system of claim 12, wherein the monitoring station is configured to determine whether a partial discharge occurred from an insulation defect in the cable between the first and second sensors.

14. The system of claim 12, wherein the monitoring station is configured to calculate an insulation defect location using the first and second sets of signal features.

15. A data acquisition device for determining the location of insulation defects in a cable comprising:
   a first input configured to receive a first signal from a first sensor;
   an analysis module configured to receive the first signal from the first input and to extract a first set of signal features from the first signal when data indicating a partial discharge is detected in the first signal;
   a second input coupled to a transceiver and configured to receive a second set of signal features extracted from a second signal from a second sensor; and
   a decision module configured to receive the first and second sets of signal features and to compare the first and second set of signal features to detect an insulation defect.

16. The device of claim 15, wherein the decision module is configured to determine whether an insulation defect exists on the cable between the first and second sensors.

17. The device of claim 15, wherein the decision module is configured to calculate an insulation defect location using the first and second sets of signal features.

18. The device of claim 17, wherein the transceiver comprises a wireless transceiver configured to wirelessly transmit the insulation defect location to a gateway device.

19. The device of claim 17, wherein the transceiver comprises a wireless transceiver configured to wirelessly transmit data to a monitoring station.

20. The device of claim 15, wherein the transceiver comprises a wireless transceiver configured to wirelessly transmit data to a second data acquisition device.

* * * * *